United States Patent [19]
Pitz et al.

[11] Patent Number: 5,796,672
[45] Date of Patent: Aug. 18, 1998

[54] METHOD AND CIRCUIT FOR ROUTING DATA TO REGISTERS IN AN INTEGRATED CIRCUIT

[75] Inventors: Jeanne K. Pitz, Richardson; Fredrick W. Trafton, Lewisville; Richard C. Pierson, Dallas, all of Tex.

[73] Assignee: Texas Instruments Incorporated, Dallas, Tex.

[21] Appl. No.: 842,342

[22] Filed: Apr. 24, 1997

[51] Int. Cl.⁶ ........................................ G11C 8/00
[52] U.S. Cl. .................. 365/230.03; 365/52; 365/221
[58] Field of Search .................. 365/230.03, 52, 365/221

[56] References Cited

U.S. PATENT DOCUMENTS 5,146,577  9/1992  Babin ................................. 711/167
5,430,859  7/1995  Norman et al. ..................... 711/103

*Primary Examiner*—David C. Nelms
*Assistant Examiner*—Hoai Ho
*Attorney, Agent, or Firm*—Bret J. Petersen; W. Daniel Swayze, Jr.; Richard L. Donaldson

[57] ABSTRACT

A method and circuit for routing data to registers in an integrated circuit is disclosed. The circuit comprises an I/O port (100) for receiving data and address signals, and a plurality of distributed memory modules (200–900) having registers (210–217). Each memory module is associated with and located adjacent to a circuit functional block. All of the memory modules (200–900) are connected to the I/O port (100) via a single data bus (40).

18 Claims, 2 Drawing Sheets

5,796,672

1

METHOD AND CIRCUIT FOR ROUTING DATA TO REGISTERS IN AN INTEGRATED CIRCUIT

TECHNICAL FIELD OF THE INVENTION

This invention relates generally to the field of disk drive circuits and more particularly to a method and circuit for routing data to registers in an integrated circuit.

BACKGROUND OF THE INVENTION

In an integrated circuit, for example on a computer microprocessor chip, it is often necessary to receive addressed digital data in serial form and distribute the data to various functional blocks on the chip. The data must typically be converted from serial to parallel form and stored in the registers indicated by the addresses which accompany the data. Generally, registers are shared resources used by several functional blocks. Each functional block can access the data stored in the registers.

In prior art systems, the serial data, serial address, and clock signals were received by a serial I/O port. This port would convert the data to parallel form, decode the addressing, and send the data on a parallel bus to the register indicated by the address. The registers were typically grouped in a single register block. Each register would then have one output line running to a functional block for each bit of memory in the register.

For example, a block of eight-bit registers might be organized into memory modules with eight registers each, each module serving a particular functional block. If the register block contained eight memory modules, then 64 output lines per module, or a total of 512 register output lines, might have to be routed around the chip to the various functional blocks served by the registers. Since routing the data within the register block from the serial I/O port to the proper register requires only an 8-bit data bus plus several address lines, the register output lines far outnumber the register input lines.

Routing many data lines on an integrated circuit uses valuable chip area. Therefore, it would be advantageous to decrease the number of data lines required to route a given amount of data to the functional blocks of the integrated circuit which require it.

SUMMARY OF THE INVENTION

A circuit for routing data to registers in an integrated circuit is disclosed. The circuit comprises an I/O port for receiving data and address signals and a plurality of distributed memory modules having registers, each memory module being connected to the I/O port via a data bus, each memory module being connected to and located adjacent to a corresponding one of the functional blocks.

A method for routing data to registers in an integrated circuit is disclosed. The method comprises the steps of receiving at an I/O port an input data signal and an input address signal; generating at the I/O port an output data signal in response to the input data signal; generating at the I/O port an output address signal in response to the input address signal; transmitting the output data signal to a memory module, the memory module being associated with and proximate to a selected one of the functional blocks, the memory module including the register; transmitting the output address signal to the memory module; receiving at the memory module the output address signal, and selecting the register in response to the output address signal; and

2 receiving at the register the output data signal and storing at the register a plurality of bits in response to the output data signal.

For example, if eight memory modules, each containing eight registers, are distributed on an integrated circuit chip near their respective functional blocks, only 13 signal lines must be routed across the chip from the I/O port to each memory module. The 13 lines include eight lines for an eight-bit parallel data bus, a three-bit register address bus to select a particular register within a memory module, and a module select line to cause the selected module to process the transmitted data and address information. The 512 register output lines, which in previous systems would be routed across the chip from the register block to the various functional blocks, need only be routed the short distance from the distributed memory modules to their respective functional blocks. This significantly reduces the amount of chip surface area dedicated to data lines, and decreases chip manufacturing costs.

A technical advantage of the invention is that a register distribution system in accordance with the invention reduces the number of lines routed on the chip by distributing the memory modules among the functional blocks to which they are assigned. Another technical advantage is that, with a reduced number of lines routed on the chip, the chip area taken up by data lines is reduced, as is the cost of fabrication of the chip.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF THE INVENTION

Figure 1:
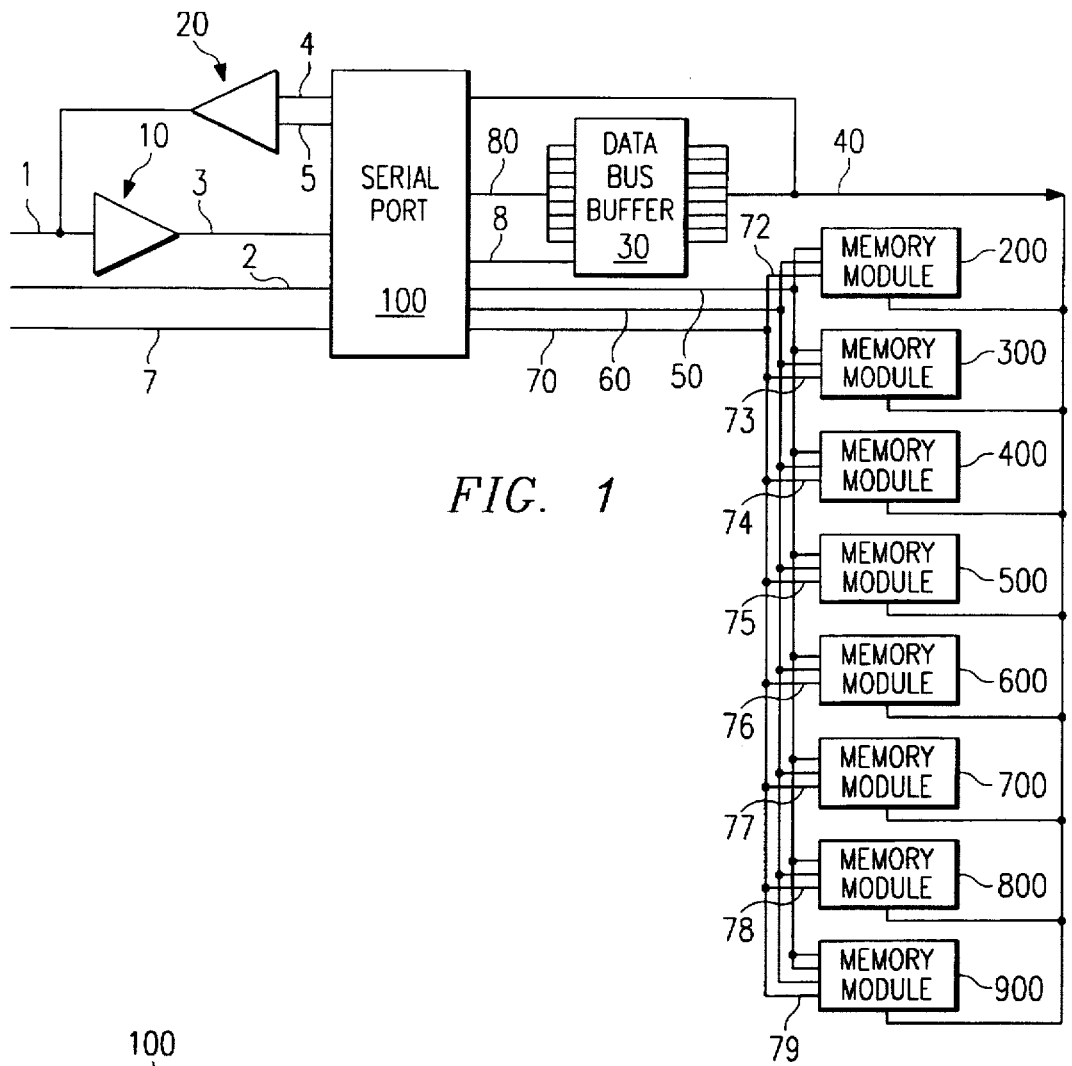
FIG. 1 is an overall block diagram of a distributed register system in accordance with the invention.
Figure 2:
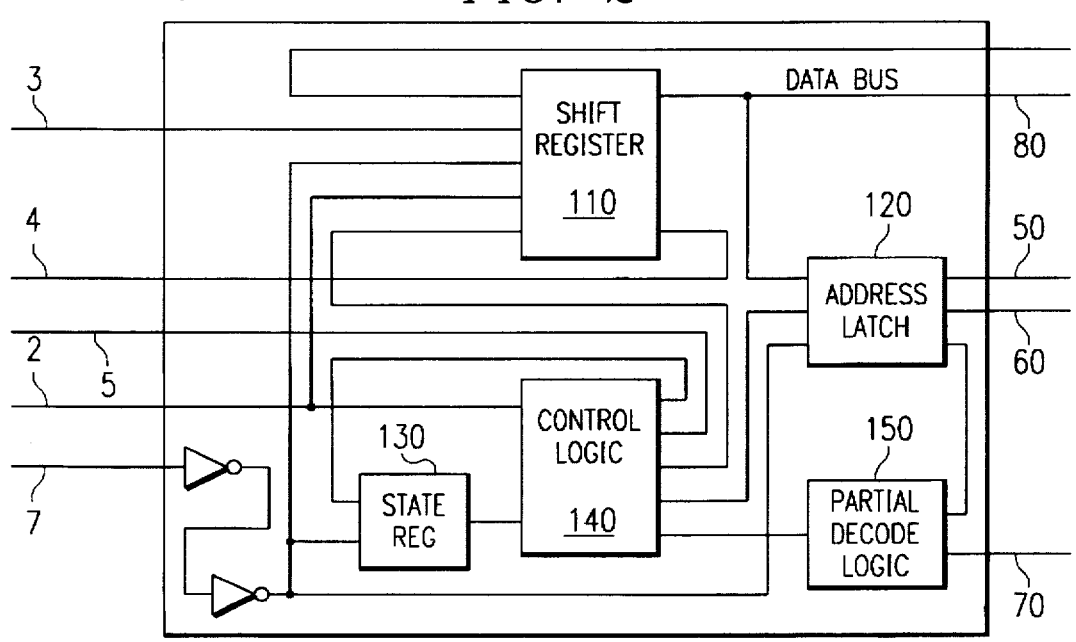
FIG. 2 is a functional block diagram of a serial I/O port.
Figure 3:
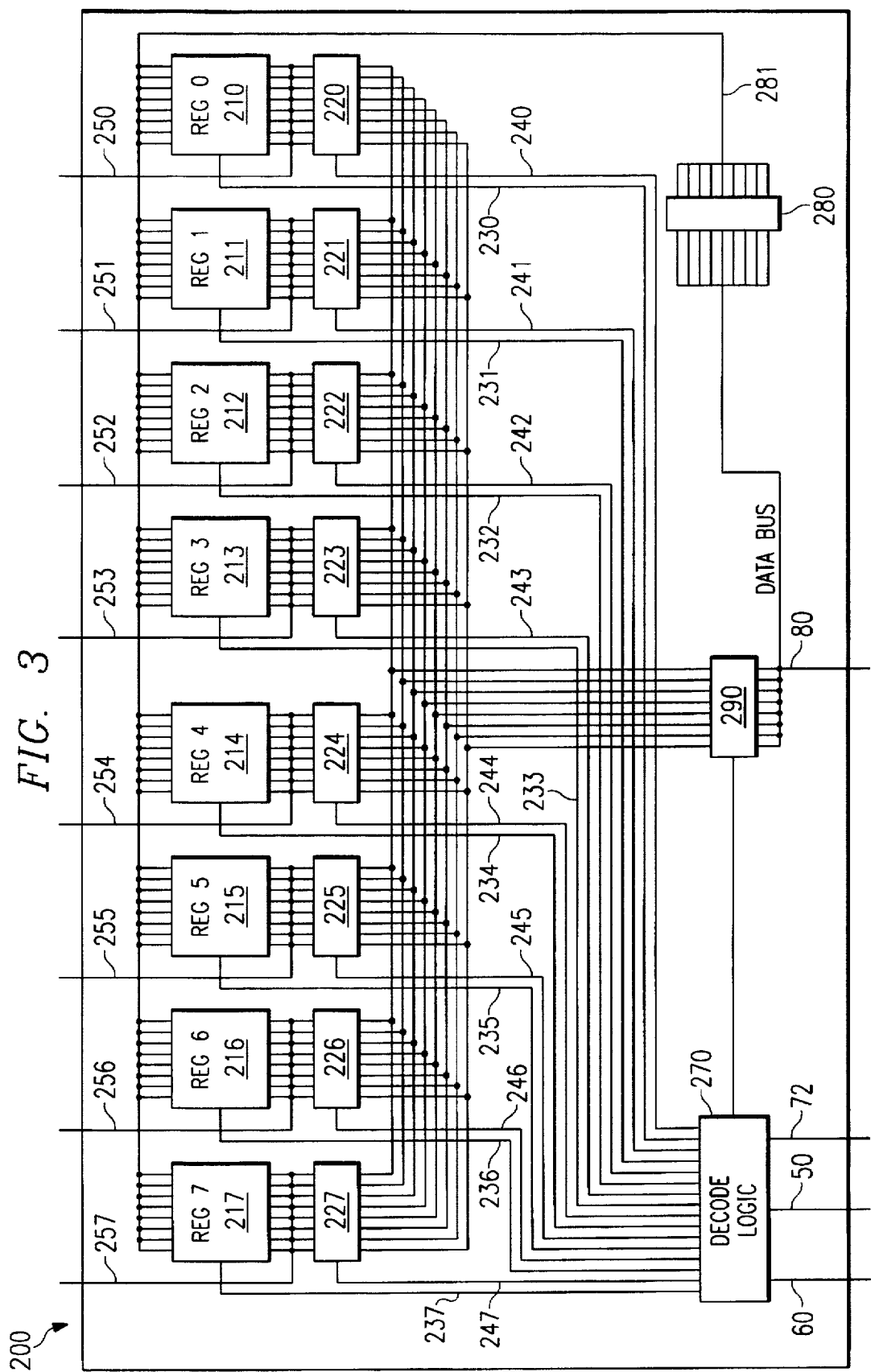
FIG. 3 is a functional block diagram of a memory module.

The preferred embodiment of the present invention and its advantages are best understood by referring to FIGS. 1 through 3 of the drawings, like numerals being used for like and corresponding parts of the various drawings.

Referring to FIG. 1, serial input signals, comprising data to be stored in a particular register and address signals indicating which register is to store the data, are received and buffered by input buffer 10 on input line 1. Serial I/O port 100 is enabled by a signal on input line 2. When enabled, serial port 100 responds to the buffered input signals received on line 3. Serial port 100 also receives a clock signal on input line 7.

Serial I/O port 100 converts the serial data into an eight-bit parallel data signal, and partially decodes the address signals in a manner to be described below. The parallel data signal is buffered by data bus buffer 30 and output to the memory modules 200–900 on data bus 40.

Serial I/O port 100 partially decodes the address signals received on input line 3 by separating the address information into three parts: a module select signal which is output on module select group 70, a read/write signal transmitted on line 50, and a three-bit register address transmitted on line 60. Module select group 70 comprises eight separate module select lines 72–79. The module select lines 72–79 specify which module is to receive the data. Each memory module 200–900 is connected to and activated by one of the module select lines 72–79.

Register address line 60, a three-bit bus which is received by all the memory modules 200–900, specifies which register within the currently activated memory module is being addressed. Read/write line 50 specifies whether data is to be written to or read from the selected register.

Output buffer 20 receives serial output data on line 4 and an enabling signal on line 5 from serial I/O port 100. When enabled during a read operation, output buffer 20 buffers the serial output data received on line 4 and transmits buffered data on line 1.

Referring to FIG. 2, serial I/O port 100 includes shift register 110, address latch 120, state register 130, control logic block 140, and partial decode logic block 150. Shift register 110 receives serial input signals on line 3, converts the data portion to parallel form, and transmits the data on eight-bit data bus 80.

Shift register 110 converts the address signals to parallel form. The parallel address signal contains 7 bits indicating the memory module (three bits) and the register (another three bits) which have been selected for data transmission, and whether data is to be written to or read from the selected register (one bit). The parallel address signal is transmitted to address latch 120.

Address latch 120 transmits the three register selection bits and the read/write bit of the parallel address signal to the memory modules on lines 60 and 50, respectively. Address latch 120 sends the module selection bits of the parallel address signal to partial decode logic block 150.

Only three module selection bits are used by shift register 110 and address latch 120 to uniquely designate each of the eight memory modules 200–900. However, the desired module selection output from serial I/O port 100 is a set of eight lines, each individually activating its own memory module. Thus, the three-bit module selection signal from address latch 120 is decoded by partial decode logic block 150, and a module select signal is sent to the appropriate one of the memory modules via module select group 70, which comprises eight module select lines 72–79.

The incoming clock signal on line 7 is received by shift register 110, address latch 120 and state register 130. State register 130 and control logic block 140 monitor the incoming enable and clock signals on lines 2 and 7, respectively, and coordinate the transmission of data within and outside serial I/O port 100. This is accomplished by means of control signals transmitted to shift register 110, address latch 120 and partial decode logic block 150.

Control logic block 140 also sends an output buffer enabling signal on line 5 to output buffer 20 (shown in FIG. 1). This signal enables output buffer 20 to buffer the serial output data on line 4 during a read operation.

Referring to FIG. 3, a diagram of an exemplary memory module 200 is shown. Memory module 200 comprises decode logic block 270, eight-bit registers 210–217, register output controllers 220–227, input data bus driver 280, and output data bus driver 290.

Decode logic block 270 receives signals on module select line 72, read/write line 50 and address line 60. Decode logic block 270 decodes the three address bits from address line 60 to determine which register is being addressed. For illustrative purposes, it will be assumed that register 217 is being addressed. However, it will be recognized that any other register 210–216 could be selected with similar results.

Decode logic block 270 determines from the read/write signal on line 50 whether a read or write operation is intended. If a write operation is indicated, decode logic block 270 will activate register 217 via line 237. Register 217 will then store the data received on data bus 281 from input bus driver 280.

If a read operation is indicated, decode logic block 270 will activate register output controller 227 and output bus driver 290. Register output controller 227 will allow the contents of register 217 to be transmitted on data bus 80 by output bus driver 290.

Data stored in registers 210–217 can be read at any time by the functional block(s) (not shown) to which memory module 200 is assigned. This is accomplished by means of read data buses 250–257, respectively.

Because memory module 200 is located in proximity to its respective functional block(s), read data buses 250–257, which comprise a total of 64 output lines, need not be routed across the chip. Instead, only data bus 80, read/write line 50, address line 60, and one of the module select lines 72–79, or a total of 13 data lines, must be routed across the chip to each memory module. This significantly reduces the amount of chip surface area dedicated to data lines, and decreases chip manufacturing costs.

While the invention has been particularly shown and described by the foregoing detailed description, it will be understood by those skilled in the art that various other changes in form and detail may be made without departing from the spirit and scope of the invention.

What is claimed is:

1. An integrated circuit for routing data to and from a plurality of registers, the circuit comprising:
    an I/O port for receiving data and address signals having a first register address decoder; and
    a plurality of distributed memory modules, each memory module being connected to the I/O port via a data bus, each memory module being connected to and located adjacent to a corresponding one of a plurality of functional blocks;
    wherein said first register address decoder receives the address signal and transmits a register address signal to the selected memory module;
    and wherein each memory module further comprises a second register address decoder, for receiving the register address signal from the first register address decoder and for transmitting a register select signal to a selected one of the registers of the memory module in response to the register address signal.

2. The circuit of claim 1, wherein the I/O port comprises a module select decoder for receiving the address signal, for selecting one of the memory modules in response to the address signal, and for transmitting a module select signal to the selected memory module.

3. The circuit of claim 1, wherein the data signal received by the I/O port comprises a serial data signal, and wherein the I/O port comprises a serial-to-parallel converter, for receiving the data signal and for transmitting a parallel output data signal on the data bus in response to the data signal.

4. The circuit of claim 1, further comprising an address bus for transmitting the register address signal from the first register address decoder to the selected memory module.

5. The circuit of claim 1, wherein each memory module has at least one of the plurality of registers.

6. An integrated circuit formed on a single substrate, comprising:

a plurality of circuit functional blocks;

an I/O port for receiving address and data signals, and for generating module select, register address, and output data signals;

a memory module associated with and located adjacent to a selected one of the circuit functional blocks;

a data bus connected to the I/O port and the memory module, for transmitting the output data signal to the memory module;

an address bus connected to the I/O port and the memory module, for transmitting the register address signal to the memory module; and a plurality of memory output lines for transmitting memory output signals from the memory module to the selected circuit functional block.

7. The integrated circuit of claim 6, further comprising a module select line connected to the I/O port and the memory module, for transmitting the module select signal to the memory module.

8. The integrated circuit of claim 6, wherein the memory module comprises a plurality of registers connected to the data bus, for receiving the output data signal and for storing data in response to the output data signal.

9. The integrated circuit of claim 8, wherein each register is connected to a plurality of the memory output lines.

10. The integrated circuit of claim 6, wherein the I/O port comprises an address decoder, for receiving the address signal and for generating the module select and register address signals in response to the address signal.

11. The integrated circuit of claim 6, wherein the I/O port comprises a shift register, for receiving the data signal and for generating the output data signal, the data signal comprising a serial data signal and the output data signal comprising a plurality of parallel bits.

12. The integrated circuit of claim 6, wherein the memory module comprises a register address decoder, for receiving the register address signal, for selecting one of the plurality of registers in response to the register address signal, and for transmitting a register select signal to the selected register.

13. A method for distributing data to a register in an integrated circuit, the integrated circuit having a plurality of functional blocks, the method comprising the steps of:

receiving at an I/O port an input data signal and an input address signal;

generating at the I/O port an output data signal in response to the input data signal;

generating at the I/O port an output address signal in response to the input address signal;

transmitting the output data signal and the output address signal to the memory modules, each memory module being associated with and proximate to a selected one of the functional blocks;

receiving at the memory modules the output address signal;

selecting one of the plurality of memory modules in response to the input data signal, the selected memory module including the register;

transmitting a module select signal to the selected memory module;

selecting the register in response to the output address signal and the module select signal; and receiving at the register the output data signal and storing at the register a plurality of bits in response to the output data signal.

14. The method of claim 13, wherein the output data signal comprises a parallel data signal.

15. The method of claim 13, wherein the input data signal comprises a serial data signal.

16. The method of claim 13, wherein the output address signal comprises a parallel data signal.

17. The method of claim 13, wherein the input address signal comprises a serial data signal.

18. The method of claim 13, further comprising the step of transmitting a memory output signal from the register to a selected functional block.

* * * * *